United States Patent
Kyle et al.

(10) Patent No.: US 8,435,426 B2
(45) Date of Patent: May 7, 2013

(54) ELECTRICAL CONTACT ENHANCING COATING

(76) Inventors: Brian K. Kyle, Dana Point, CA (US); Timothy R. Mrock, Pembroke, NH (US)

(*) Notice: Subject to any disclaimer, the term of this patent is extended or adjusted under 35 U.S.C. 154(b) by 119 days.

(21) Appl. No.: 13/053,978

(22) Filed: Mar. 22, 2011

(65) Prior Publication Data

US 2011/0168958 A1   Jul. 14, 2011

Related U.S. Application Data

(62) Division of application No. 11/641,715, filed on Dec. 20, 2006, now Pat. No. 7,910,026.

(51) Int. Cl.
  *H01B 1/22* (2006.01)
  *H01B 3/20* (2006.01)
(52) U.S. Cl.
  USPC ............ 252/514; 252/570; 252/572; 252/579
(58) Field of Classification Search .................... 252/514
  See application file for complete search history.

(56) References Cited

U.S. PATENT DOCUMENTS

| | | | |
|---|---|---|---|
| 3,539,114 A | 11/1970 | Short | 241/16 |
| 4,446,059 A | 5/1984 | Eustice | 252/514 |
| 4,574,056 A | 3/1986 | Komura | |
| 4,643,843 A | 2/1987 | Lowdon | |
| 5,087,314 A | 2/1992 | Sandborn et al. | 156/330 |
| 5,209,873 A | 5/1993 | Yamamoto et al. | |
| 5,422,190 A * | 6/1995 | Alexander | 428/552 |
| 5,866,044 A | 2/1999 | Saraf et al. | |
| 6,156,237 A | 12/2000 | Kubota et al. | |
| 6,197,222 B1 | 3/2001 | Saraf et al. | |
| 6,265,341 B1 | 7/2001 | Komatsu et al. | |
| 6,399,282 B1 | 6/2002 | Kubota et al. | |
| 2002/0171065 A1 | 11/2002 | Lochun et al. | |

FOREIGN PATENT DOCUMENTS

| | | |
|---|---|---|
| JP | 59-221362 | 12/1984 |
| JP | 62-4760 | 1/1987 |
| JP | 10-106346 | 4/1998 |
| JP | 10-106348 | 4/1998 |
| JP | 10-106349 | 4/1998 |

\* cited by examiner

*Primary Examiner* — Peter F Godenschwager
(74) *Attorney, Agent, or Firm* — Richard C. Litman

(57) ABSTRACT

The electrical contact enhancing coating is a composition that includes finely divided precious metal particles mixed with a dielectric carrier to form a coating. The dielectric carrier is a vegetable oil (preferably soybean-based) carrier of the type used as a dielectric coolant in power transformers, and is preferably high in antioxidant content. In a first embodiment, the precious metal is 100% silver having an average particle size of about 5-10 μm. In a second embodiment, the precious metal is about 65-85% silver and 15-35% gold (average particle size 0.5-1.8 μm), by weight. In a third embodiment, the precious metal is about 65-85% silver, 12.5-30% gold, and 2.5-5% palladium (average particle size 0.5-1.8 μm), by weight. The precious metals may be cryogenically treated prior to mixing with the dielectric carrier.

4 Claims, No Drawings

ELECTRICAL CONTACT ENHANCING COATING

CROSS-REFERENCE TO RELATED APPLICATION

This application is a division of application Ser. No. 11/641,715 filed Dec. 20, 2006, now U.S. Pat. No. 7,910,026.

BACKGROUND OF THE INVENTION

1. Field of the Invention

The present invention relates to electrical contacts and connectors, and to compositions to improve electrical conductivity, and more particularly to an electrical contact enhancing coating for enhancing conductivity between electrical conductors.

2. Description of the Related Art

Electrical contacts and connectors are subject to oxidation from exposure to the air and to damp, humid, or moist environments. The oxides of many metals, e.g., copper oxides, are nonconductive, thereby increasing electrical resistance, resulting in a loss of energy and power transfer. In addition, when viewed under a microscope, machined or plated electrical contacts have a rough surface finish, sometimes resulting in less than 5% surface contact between the two conductors. The decreased surface contact between the two surfaces can result in micro-arcing, with consequent distortion of audio and video signals, decreased power transfer, and lower energy efficiency.

Consequently, there is a need for a way to increase conductivity between electrical connectors and contacts to increase energy efficiency and decrease distortion of electrical signals. Thus, an electrical contact enhancing coating solving the aforementioned problems is desired.

SUMMARY OF THE INVENTION

The electrical contact enhancing coating is a composition that includes a finely divided precious metal powder component mixed with a dielectric carrier component to form a coating. The dielectric carrier component is a vegetable oil (preferably soybean-based) carrier of the type used as a dielectric coolant in power transformers, and is preferably high in antioxidant content. In a first embodiment, the precious metal is 100% silver having an average particle size of about 5-10 µm, the actual particle size ranging up to 25 µm. In a second embodiment, the precious metal is about 65-85% silver and 15-35% gold (average particle size 0.2-3 µm, actual particle size ranging up to 15 µm), by weight. In a third embodiment, the precious metal is about 65-85% silver, 12.5-30% gold, and 2.5-5% palladium (average particle size 0.5-1.8 µm, actual particle size ranging up to 10 µm), by weight. The precious metals may be cryogenically treated, preferably doubly, prior to mixing with the dielectric carrier.

The composition has the consistency of a thick paint. The composition is applied to one side of the electrical connections while wet. The electrical connections are put together while the coating is still wet. The coating cures or hardens by polymerization of the dielectric carrier upon exposure to air over a period of time. The cured or hardened dielectric protects the electrical connection from deterioration caused by oxidation, providing an electrical connection protectant that results in energy savings and extends the life of electrical connectors and contacts. It is also believed that the precious metal particles are conditioned by the application of current and curing of the dielectric to provide an improved conductive path through the two electrical contact surfaces, with better power transfer and fidelity of electrical (e.g., audio and visual) signal transfer.

These and other features of the present invention will become readily apparent upon further review of the following specification.

DETAILED DESCRIPTION OF THE PREFERRED EMBODIMENTS

The present invention is an electrical contact enhancing coating in the form of a composition that includes a finely divided precious metal powder component mixed with a dielectric carrier component to form a coating. The composition has the consistency of a thick paint. The composition is applied to one side of the electrical connections while wet. The electrical connections are put together while the coating is still wet. The coating cures or hardens by polymerization of the dielectric carrier upon exposure to air over a period of time, joining the two electrical components. The cured or hardened dielectric protects the electrical connection from deterioration caused by oxidation, providing an electrical connection protectant that results in energy savings and extends the life of electrical connectors and contacts. It is also believed that the precious metal particles are conditioned by the application of current and curing of the dielectric to provide an improved conductive path through the two electrical contact surfaces, with better power transfer and fidelity of electrical (e.g., audio and visual) signal transfer. The two electrical components may later be separated by using alcohol and a swab, since the dielectric carrier is soluble in alcohol.

The dielectric carrier is a vegetable oil (preferably soybean-based) carrier of the type used as a dielectric coolant in power transformers, and is preferably high in antioxidant content. Vegetable oil-based dielectric fluids are well known in the electrical arts, and have gained popularity as a dielectric coolant in power transformers as an alternative to mineral oil because of their higher flash point and resistance to fire, as well as biodegradability. It is preferred that the dielectric carrier be soybean-based, and also have a high antioxidant content either naturally or by admixture of organic antioxidant additives with the soybean oil. A representative dielectric carrier suitable for use in the present invention is Envirotemp® FR3™ Fluid (Envirotemp and FR3 are trademarks of Cooper Power Systems, Inc. of Houston, Tex.). Envirotemp FR3 contains greater than 98.5% natural esters derived from edible seed oils, including saturated and unsaturated fatty acids with $C_{14}$ to $C_{22}$ chains, and less than 1.5% food-grade antioxidant additives to prevent the unsaturated bonds from polymerizing with oxygen from the air.

In order to achieve the proper consistency of the coating, it has been found that the ratio of precious metal component to dielectric carrier component should range between about 65%-85% precious metal to about 15%-35% dielectric carrier, by weight. A representative example would include 10 grams of precious metal component and 3.5 grams of dielectric carrier component, a ratio of 74%:26% by weight.

In a first embodiment, the precious metal is 100% silver. The silver is preferably of the flake form, and has an average particle size of about 5-10 µm, the actual particle size ranging up to 25 µm. The silver may be subject to cryogenic treatment, preferably double cryogenic treatment, prior to mixing with the dielectric carrier, i.e., the silver flakes are lowered to the temperature of liquid nitrogen (about −320° C.) in ramped stages, then allowed to return to room temperature. This procedure may be repeated twice. It is believed that cryogenic treatment rearranges the structure of the metal in such a manner that audiophiles find a better reproduction of audio signals, e.g., better dynamic range, softened highs, etc.

In a second embodiment, the precious metal comprises a mixture of between about 65%-85% silver and 15%-35% gold, by weight, more preferably about 85% silver and 15% gold. The silver powder is a highly conductive flake form with an average particle size of 5-10 µm, actual particle size ranging up to 25 µm. The gold powder is a highly conductive flake form with an average particle size of 0.2-3 µm, actual particle size ranging up to 15 µm. The two precious metals are blended together in the appropriate weight ratio, and may be subjected to cryogenic treatment, preferably double cryogenic treatment, as described above, prior to mixture with the dielectric carrier.

In a third embodiment, the precious metal comprises a mixture of between about 65%-85% silver, about 12.5%-30% gold, and about 2.5%-5% palladium, by weight, more preferably about 85% silver, 12.5% gold and 2.5% palladium. The silver powder is a highly conductive flake form with an average particle size of 5-10 µm, actual particle size ranging up to 25 µm. The gold powder is a highly conductive flake form with an average particle size of 0.2-3 µm, actual particle size ranging up to 15 µm. The palladium powder is a spherical-shaped material having an average particle size of about 0.5-1.8 µm, actual particle size ranging up to 10 µm. The three precious metals are blended together in the appropriate weight ratio, and may be subjected to cryogenic treatment, preferably double cryogenic treatment, as described above, prior to mixture with the dielectric carrier.

As noted above, the coating cures or hardens by polymerization of the dielectric carrier upon exposure to air over a period of time. Preliminary testing has shown that resistance across the electrical connection is reduced by about 10% after a period of about four hours. However, the curing process may take considerable time, and a gradual energy savings and increase of audio and visual signal transfer quality will be noted, with a leveling off after about three-eight months curing.

It is believed that the precious metal particles are conditioned by the application of current and curing of the dielectric to provide an improved conductive path through the two electrical contact surfaces, thereby providing an electrical protectant that results in energy savings and with better power transfer and fidelity of electrical (e.g., audio and visual) signal transfer. It may also be that curing of the dielectric results in a lower dielectric constant, bringing the voltage and current more in phase, resulting in better power transfer without the need for reactive compensation.

After curing, the coating increases electrical conductivity across the electrical connections, thereby increasing efficiency and minimizing wasted energy that is transformed into heat; lowers resistance across the electrical connections; decreases "micro-arcing" across the connections; the dielectric carrier, once polymerized via an atmospheric oxygen reaction, protects the contact from future oxidation; the oxides of silver, to the extent formed, are highly conductive; and cryogenic treatment, when provided, increases the conductivity and efficiency of the conductive metals on an atomic level.

The coating may be used in residential power, commercial power, industrial, automotive and any other applications that would benefit from energy savings, decreased resistance across the electrical connection, and life extension of electrical products and appliances. This specifically includes, but is not limited to, circuit panels and breaker boxes; power transmission devices; power transmission wire/cabling; lighting; automotive connections; solar arrays; hybrid and conventional vehicles, etc.

It is to be understood that the present invention is not limited to the embodiments described above, but encompasses any and all embodiments within the scope of the following claims.

We claim:

1. An electrical contact enhancing coating, comprising a mixture of:
   a precious metal powder component containing:
      silver flakes having an average particle size between about 5 µm and 10 µm, actual particle size ranging up to 25 µm;
      gold flakes having an average particle size between about 0.2 µm and 3 µm, actual particle size ranging up to 15 µm;
      palladium spherical particles having an average particle size between about 0.5 µm, and 1.8 µm, actual particle size ranging up to 10 µm; and
   a vegetable oil-based dielectric carrier polymerizable with oxygen from the air.

2. The electrical contact enhancing coating according to claim 1, wherein said precious metal powder component comprises, by weight:
   between about 65% to 85% silver;
   between about 12.5% to 30% gold; and
   between about 2.5% to 5% palladium.

3. The electrical contact enhancing coating according to claim 1, wherein said silver flakes, said gold flakes, and said palladium spherical particles are cryogenically treated powders.

4. A method for protecting an electrical connection to increase energy efficiency, comprising the steps of:
   coating a first electrical contact with a coating, wherein the coating contains:
      i) silver flakes having an average particle size between about 5 µm and 10 µm, actual particle size ranging up to 25 µm;
      ii) gold flakes having an average particle size between about 0.2 µm and 3 µm, actual particle size ranging up to 15 µm;
      iii) palladium spherical particles having an average particle size between about 0.5 µm and 1.8 µm, actual particle size ranging up to 10 µm; and
      iv) a vegetable oil-based dielectric carrier polymerizable with oxygen from the air;
   mating the first electrical contact with a second electrical contact to form the electrical connection; and
   exposing the mated electrical contacts to air in order to polymerize the dielectric carrier, whereby the electrical connection is protected against oxidation to increase energy efficiency.

* * * * *